United States Patent [19]

Valayil et al.

[11] Patent Number: 4,512,818
[45] Date of Patent: Apr. 23, 1985

[54] SOLUTION FOR FORMATION OF BLACK OXIDE

[75] Inventors: Silvester Valayil, Shrewsbury; Magda Abu-Moustafa, Lexington; Terry A. Benjamin, Acton, all of Mass.

[73] Assignee: Shipley Company Inc., Newton, Mass.

[21] Appl. No.: 616,692

[22] Filed: Jun. 4, 1984

Related U.S. Application Data

[63] Continuation-in-part of Ser. No. 497,084, May 23, 1983, abandoned.

[51] Int. Cl.$^3$ ............................. C23F 5/02; C23F 5/04
[52] U.S. Cl. ......................... 148/6.14 R; 148/6.15 R; 252/187.23
[58] Field of Search ................ 148/6.14 R; 117/134; 260/590 R; 252/187.23; 29/625; 361/410; 156/659; 220/64

[56] References Cited

U.S. PATENT DOCUMENTS

| | | | |
|---|---|---|---|
| 2,417,885 | 3/1947 | Powell et al. | 198/6.14 R |
| 2,460,896 | 2/1949 | Meyer | 148/6.14 R |
| 2,460,898 | 2/1949 | Meyer | 148/6.14 R |
| 2,464,596 | 3/1949 | Mason | 148/6.14 R |
| 2,481,854 | 9/1949 | MacMahon | 198/6.14 R |
| 2,593,922 | 4/1952 | Robinson et al. | 148/6.14 R |
| 3,677,827 | 7/1972 | Weaver et al. | 148/6.14 R |
| 4,409,037 | 10/1983 | Landau | 198/6.14 R |

Primary Examiner—George F. Lesmes
Assistant Examiner—William M. Atkinson
Attorney, Agent, or Firm—Robert L. Goldberg

[57] ABSTRACT

There is disclosed a formulation for the formation of a black oxide particularly useful in the fabrication of multi-layered printed circuits. The formulation comprises an oxidant and a hydroxide and is characterized by the addition of a water soluble or dispersible polymer to regulate the properties of the black oxide solution.

22 Claims, No Drawings

SOLUTION FOR FORMATION OF BLACK OXIDE

CROSS REFERENCE TO RELATED APPLICATION

This application is a continuation-in-part of copending U.S. patent application Ser. No. 497,084 filed May 23, 1983 now abandoned.

BACKGROUND OF THE INVENTION

1. Introduction

This invention relates to a solution for the formation of a black oxide layer over various metals, and more particularly, to the formation of a black oxide layer over copper that is especially useful for increasing the adhesion of copper to a dielectric material in the fabrication of multilayer printed circuit boards.

2. Description of the Prior Art

Multilayer printed circuit boards provide good packaging density, short conductor lengths and good reliability. At the same time, weight and space are conserved. Thus, multilayer printed circuit boards have come into increasing use during the last several years where the demand for more compact electrical apparatus has increased rapidly.

A multilayer printed circuit board is typically built from a desired number of insulating base materials clad on both sides with a thin, unpatterned copper layer. A positive photoresist is generally applied over the copper layers and exposed and developed to yield a relief resist image over the copper layer. The copper is etched with a suitable etchant whereby copper bared by development of the photoresist is removed and copper beneath the resist layers is protected from etchant resulting in copper circuits beneath the protective resist layer. The resist is removed and plastic layers or layers of a fiber material impregnated with partially cured or hardened plastic (prepegs) are placed between the conductive copper patterns of multiple innerlayers. Often the outer layer is not etched at this stage and consists of an unpatterned copper layer. The whole stack is pressed under heat and pressure to form a multilayer printed circuit board. Then, holes in a desired number and pattern are made in the multilayer printed circuit board and finally, using art accepted practices, the two outermost unpatterned copper layers are provided with conductive patterns by a process comprising application of a resist, exposing and etching. The necessary electrical connections between the different conductive layers is achieved through the plated through holes.

Processes for the formation of multilayer printed circuit boards are well known in the art and described in numerous publications including, for example, U.S. Pat. Nos. 4,075,757; 4,150,421; and 4,211,603 and in more detail by Coombs, *Printed Circuits Handbook*, Second Edition, McGraw-Hill Book Company, New York, Section 6 comprising pages 20-3 through 23-19, 1979; all incorporated herein by reference.

It is known in the art that there is a tendency for various layers of a multilayer printed circuit board to delaminate. Frequently, delamination occurs as a consequence of insufficient adhesion between the conductive copper patterns and the applied intermediate dielectric material. This is due to th normal smoothness of the copper conductors not providing a sufficient number of anchor points or sites for adhesion to the dielectric coating. To improve adhesion of copper to the dielectric materials, different chemical treatments of the conductive patterns have been used. One such treatment is black oxidizing of the copper conductors of the innerlayer to roughen their surface and increase their adhesion to the dielectric. Black oxidizing has met with moderate but unpredictable success.

In the aforesaid U.S. Pat. No. 4,075,757, it is recognized that there are problems attendant to the use of black oxides of copper to improve adhesion and in said patent, a roughened adhesion promoting metal layer over the conductive copper layer is substituted for the black oxide. This process is more cumbersome and costly than a black oxide layer.

The disadvantages attendant to the use of black oxide in the manufacture of multilayer circuit boards was also recognized by Slominski et al., *Plating and Surface Finishing*, Volume No. 59, June, 1982, pages 96 through 99, incorporated herein by reference. The authors recognize that adhesion between copper and a dielectric is often erratic and often unacceptable. The authors attribute this poor performance to the oxide layer being too thick, frangible, mechanically weak and lacking in homogeneity. The authors point out that others in the art have attempted to cure this problem by using thinner oxide coatings through dilution of the conventional caustic-chlorite bath used for the formation of black oxide coatings. However, these efforts have failed because a different unstable entity forms that shrinks in volume during thermal operations, again leading to delamination of the multilayer board. Finally, the authors describe their efforts to solve the black oxide problem using a spraying procedure under carefully controlled conditions to optimize the black oxide layer. The authors report that they obtained successful results, but the requirements for spray equipment and careful control of the treatment parameters make the authors' approach impractical for commercial use.

In U.S. Pat. No. 4,409,037, there is disclosed a black oxide formation characterized by an unusually high concentration of the chlorite and a chlorite to hydroxide ratio within a particular range. In accordance with the patent, the increased concentration of chlorite permits a decreased concentration of hydroxide resulting in consistent results in terms of improved adhesion.

SUMMARY OF THE INVENTION

The subject invention is directed to additives for solutions for the formation of black oxide coatings that control various properties of the black oxide coating and improve its ability to bond copper to dielectric substrates. The additives are solution soluble polymers dissolved in solution in minor amount, which additives cause the formation of a black oxide coating of reduced thickness and great homogeneity. The coatings are mechanically dense and strong and do not fracture when mechanically rubbed to yield loose granular black copper oxide powder as do the black oxide coatings formed from solutions free of the additives of the invention.

The black oxide solutions of this invention are used in the manufacture of multilayer boards in conventional manner and for other purposes and other metals as well. Using the black oxide treatment solution for improving the adhesion of copper, consistent, acceptable adhesion is regularly achieved between a copper conductor and a dielectric layer.

DESCRIPTION OF THE PREFERRED EMBODIMENT

The black oxide solutions of the invention are those solutions conventionally used in the art to blacken copper and its alloys improved by the addition of the water soluble polymer in accordance with this invention. Prior art blackening solutions for copper suitable for purposes herein typically comprise alkaline solution of an oxidant such as a chlorite or a per compound such as peroxydiphosphate. One such prior art solution is disclosed in U.S. Pat. No. 2,460,896, incorporated herein by reference. The solution comprises approximately one part by weight of a chlorite and two parts by weight of caustic soda used in an amount of from one to two pounds of dry solids per gallon of water. The solution is operated at a temperature of between 200° F. and 212° F. An improved solution is disclosed in U.S. Pat. No. 2,437,441, incorporated herein by reference, wherein to the above basic formulation, there is added a phosphate compound in an amount of from about 0.5% to about 3% of the total weight of the chlorite and hydroxide. This solution is operated at approximately the same temperature as the solution of the above cited patent, but the immersion time in the blackening solution is somewhat shorter. In accordance with the aforesaid U.S. Pat. No. 4,409,037, the black oxide solution should have a chlorite concentration in excess of 100 grams per liter and hydroxide relative to the chlorite on a weight ratio basis less than 1:8. Based upon the teachings of the above three patents, a preferred black oxide base solution, to which the additive of the invention may be added, is set forth below:

| | |
|---|---|
| Alkali metal chlorite | 20-130 gm/l |
| Alkali metal hydroxide | 5-30 gm/l |
| Trialkali metal phosphate | 2-10 gm/l |
| Water | to 1 liter |

Another formulation for the formation of black oxides of copper that may be improved with the additives of this invention is disclosed in U.S. Pat. No. 3,657,023 incorporated herein by reference. The black oxide solution of this patent comprises a mixture of a peroxydiphosphate compound, such as potassium peroxydiphosphate (i.e., $K_4P_2O_8$) together with sodium or potassium hydroxide. Useful peroxydiphosphate compounds include ammonium peroxydiphosphate; the alkali metal peroxydiphosphates such as sodium, potassium and lithium peroxydiphosphates; the alkaline earth metal peroxydiphosphates such as the calcium and magnesium salts thereof, and mixtures thereof. Such compositions are typically formulated as pulverulent mixtures which, when dissolved in a suitable amount of water, form solutions useful for coloring copper or copper alloy surfaces a deep black. Such solutions typically contain from about 7.7 to about 66.7% of the peroxydiphosphate compound with the balance being sodium hydroxide or potassium hydroxide on a dry solids basis. In employing such compositions to prepare an aqueous blackening solution, a sufficient quantity of the dry composition is mixed with water to yield a blackening solution containing from about 5 to about 120 grams per liter of the peroxydiphosphate compound and from about 60 to about 120 grams per liter of sodium or potassium hydroxide. Such blackening solutions are operated at a temperature of between about 150° F. to about 210° F. and preferably between about 165° F. to about 205° F. Immersion time in the bath necessary to develop a satisfactory black coating on the surface of the copper or copper alloy being treated, generally varies over a wide range and usually would be from about 5 to about 30 minutes or more depending upon other operating conditions.

The black oxide solutions of this invention are those of the prior art improved by the addition of a small but effective amount of a solution soluble or dispersible synthetic or natural polymer. The polymers useful herein include cellulose ethers, various starches, polyvinyl alcohol, polyvinyl pyrrolidone and copolymers thereof, peptones, gelatin, polyamides, polyacrylamides and copolymers thereof, casein, sodium alginate, etc. The molecular weight of the polymer does not appear to be critical, and some of the above materials may be used in liquid form and others in the form of polymers with very high molecular weight. The amount of addition of such polymer to the black oxide solutions does not appear to be critical, from a few parts per million (e.g., 0.002 grams per liter) up to thousands of parts per million (e.g., about 10.0 grams per liter) being usable, the smaller quantities being useful although excess amounts undesirably increase solution viscosity. Preferred amounts are from about 3 parts per million (0.003 grams/liter) to about 100 parts per million (0.1 grams/liter) while the most preferred concentrations are from about 5 to 20 parts per million parts of solution.

The black oxide solutions of this invention are used in a conventional manner. Prior to immersion of the surface of a copper or copper alloy article in the blackening solution, it is desirable to first subject the copper article to a soaking action in any of the conventionally employed neutral or alkaline cleaning baths, followed by an acid dip. The aqueous alkaline cleaning bath can be, for example, an admixture of trisodium phosphate, sodium carbonate and an alkaline stable surfactant to facilitate wetting of the surface or any of the other numerous alkaline cleaning compositions well known in the art can be employed. In the second step of the cleaning operation, the acid dip employed can be, for example, sulfuric acid, nitric acid, sulfuric acid-nitric acid bright dip, chromic acid bright dip, etc. Preferably, after the alkaline cleaning step and subsequent to the acid treatment step, the article is thoroughly washed with cold water.

The copper blackening process of this invention comprises the following steps:

1. Subjecting the surface of the copper or copper alloy article to the action of an alkaline cleaning solution,
2. rising the article in cold water,
3. immersing the article in an acid dip,
4. rinsing the article in cold water,
5. blackening the surface of the article thus cleaned by immersing in a hot aqueous blackening solution of the invention,
6. rinsing the blackened article in cold water followed by rinsing in hot water, and
7. drying the thus-blackened article.

The drying of the blackened copper surface may be accomplished in a variety of ways well known in the art such as, for example, by passing the articles on a conveyor through a tunnel drier maintained at a temperature of about 150° F.; or the blackened articles after being rinsed with hot water may be allowed to dry at room temperature under ambient conditions.

The invention will be better understood with reference to the examples that follow:

EXAMPLE 1

A copper clad laminate comprising copper foil over epoxy and measuring 2" by 4" was cleaned in a soak cleaner identified as Neutraclean 68 cleaner available from Shipley Company Inc. of Newton, Mass., by immersion of the part in the cleaner for 5 minutes at 150° F. The part was then rinsed and etched in an etchant identified as Pre-etch 748 etchant from Shipley Company Inc. by immersion for 5 minutes at room temperature. The parts was then rinsed and immersed in the following black oxide bath for 5 minutes at 195° F.

| | |
|---|---|
| Sodium chlorite | 30 gm/l |
| Sodium hydroxide | 10 gm/l |
| Trisodium phosphate | 5 gm/l |
| Water | to 1 liter |

Following immersion in the above formulation, the part was dried and inspected. The oxide layer was brown to black and relatively thick. The coating was tested for adhesion using a clear tape. The tape was pressed on the surface of the oxide and pulled off in a single motion. The coating gave a brown to black film on the tape. The coating was also tested by mechanically wiping the same with a piece of paper. When wiped, the paper was covered with black particles of a nonadherent oxide.

EXAMPLE 2

The procedure of Example 1 was repeated with 5 ppm of the Vinol polyvinyl alcohol added to the solution. The Vinol polymer was from Airco Chemical Company and was added as a 4% aqueous solution. The procedure of Example 1 using the copper clad laminate was repeated substituting the black oxide solution containing the Vinol polymer for that used in Example 1. The oxide coating formed was tested with the tape and paper and it was found that no particles were on the tape nor the paper following the test.

EXAMPLE 3

The procedure of Example 2 was repeated with the concentration of sodium chlorite increased to 120 grams per liter and the concentration of sodium hydroxide increased to 20 grams per liter. The equivalent results were obtained.

EXAMPLE 4

The following formulation was prepared:

| | |
|---|---|
| Potassium peroxydiphosphate | 120 gm/l |
| Potassium hydroxide | 60 gm/l |
| Water | to 1 liter |

The procedure of Example 1 was repeated and black oxide particles were found both on the tape and the paper following testing of the oxide coating.

EXAMPLE 5

Ten ppm of Vinol polymer (identified in Example 2) were added to the formulation of Example 4 and the procedure of Example 1 was followed. No black oxide was found on either the tape or the paper.

EXAMPLE 6

The procedure of Example 2 may be repeated substituting the following polymers for the Vinol polymer of said example in equivalent amount:

a. Natrosol hydroxymethylcellulose from Hercules Powder Company
b. Lubiscol (K-30) of BASF Chemicals Company
c. Cyanamer-p-250 polyacrylamide from American Cyanamid Corporation
d. Reten 210 modified polyacrylamide from Hercules Powder Company
e. Versamide 140 polyamide from General Mills The results obtained, substituting the above-identified polymers for the polyvinyl alcohol would yield black oxide coatings that would not yield black powder using the tape and paper tests.

Of the above examples, Examples 2 and 3 constitute preferred embodiments of the invention.

The black oxide formulations of this invention are particularly useful for the manufacture of multilayer boards. The following is a suitable procedure in accordance with the invention.

1. Check the registration of the layers and inner layers.
2. Scrub clean the copper layer to remove oxides, grease, finger prints, etc.
3. Apply photoresist to copper.
4. Expose and develop photoresist to expose and bare copper in a negative image of the circuit pattern.
5. Etch inner circuit patterns by dissolving exposed copper to provide copper conductors beneath the resist.
6. Remove remaining photoresist from the copper conductor patterns.
7. Clean copper conductors in preparation for lamination.
8. Form black oxide over copper using the black oxide formulation of Example 3.
9. Bake to remove water, solvents and chemicals used in the preparation of the inner layers.
10. Prepare B-stage resin by cutting and punching registration pin holes and stack with inner layers for lamination.
11. Laminate multilayer structure by use of heat and pressure to convert the B-stage materials between the inner layers to fully cured C-stage epoxy.
12. Post laminate bake for additional curing and bonding.
13. Drill plated through holes and laminate for interconnection between layers.
14. Debur and clean holes including an etch back for removal of exposed glass fiber ends.
15. Sensitize holes and electrolessly plate with copper.
16. Scrub outer copper surfaces for photoresist application and apply photoresist.
17. Expose and develop photoresist over outer copper layers.
18. Electroplate with copper to increase the thickness of the copper in the holes.
19. Electroplate with a tin lead alloy.
20. Mask the circuit board for edge connector plating.
21. Strip the tin-lead alloy to expose bare copper.
22. Plate nickel-gold alloy on edge connector finger pattern.
23. Reflow the tin-lead alloy.

The bond between the copper conductor of the inner layer and the dielectric insulating layer is substantially enhanced by use of the black oxide formulation of this invention (Step 8) and the rejection of multilayer boards through delamination is significantly reduced.

We claim:

1. A process for manufacturing a multilayer circuit board comprising laminating copper to a dielectric material using heat and pressure and contacting the laminate at elevated temperature with an aqueous alkaline solution of an oxidant selected from the group of salts of chlorites and per compounds containing a minor amount of a water soluble or dispersible synthetic polymer in a concentration varying between about 3 and 100 parts per million parts of solution for a time sufficient to form a dense, non-frangible oxide coating on said copper.

2. The process of claim 1 wherein a plurality of copper conductors over a dielectric substrate that have been treated with said solution to form a black oxide coating are stacked to form a multilayer printed circuit board.

3. The process of claim 1 wherein the oxidant is a chlorite.

4. The process of claim 3 where the polymer is a polyvinyl alcohol.

5. The process of claim 4 where the concentration of polyvinyl alcohol ranges between 5 and 20 parts per million parts of solution.

6. A solution for the formation of black oxide over copper or a copper alloy comprising an aqueous alkaline solution of a chlorite and from 3 parts per million parts of solution to 100 parts per million parts of solution of polyvinyl alcohol.

7. The solution of claim 6 containing a trialkali metal phosphate.

8. The solution of claim 6 where the polymer concentration varies between 5 and 20 parts per million parts of solution.

9. A solution for the formation of a black oxide coating over copper or a copper alloy comprising an aqueous alkaline solution of an oxidant selected from the group of salts of chlorites and per compounds and a water soluble or dispersible synthetic polymer in a concentration varying between about 3 parts per million parts of solution and 100 parts per million parts of solution.

10. The solution of claim 9 where the black oxide solution comprises an aqueous solution of a hydroxide and a per compound as an oxidant.

11. The solution of claim 9 where the per compound is an alkaline metal peroxydiphosphate.

12. The solution of claim 9 where the black oxide solution comprises an aqueous solution of a hydroxide and a chlorite.

13. The solution of claim 12 where the chlorite and hydroxide are each alkaline metal salts.

14. The solution of claim 13 where the concentration varies between about 5 parts per million parts of solution and 20 parts per million parts of solution.

15. The solution of claim 13 including a phosphate salt.

16. The solution of claim 15 where the phosphate is a trialkaline metal phosphate.

17. The solution of claim 13 where the polymer is selected from the group of cellulose ethers, polyvinyl alcohol, polyvinyl pyrrolidone and copolymers thereof, polyamides, and polyacrylamides and copolymers thereof.

18. The solution of claim 17 where the polymer is a cellulose ether.

19. The solution of claim 17 where the polymer is polyvinyl alcohol.

20. The solution of claim 17 where the polymer is a polyvinyl pyrrolidone.

21. The solution of claim 17 where the polymer is a polyamide.

22. The solution of claim 17 where the polymer is a polyacrylamide.

* * * * *